United States Patent
She et al.

(10) Patent No.: US 7,629,640 B2
(45) Date of Patent: Dec. 8, 2009

(54) TWO BIT/FOUR BIT SONOS FLASH MEMORY CELL

(75) Inventors: Min She, Albany, CA (US); Tsu-Jae King, Fremont, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/120,468

(22) Filed: May 2, 2005

(65) Prior Publication Data

US 2005/0242391 A1    Nov. 3, 2005

Related U.S. Application Data

(60) Provisional application No. 60/568,117, filed on May 3, 2004.

(51) Int. Cl.
H01L 29/788 (2006.01)
H01L 21/336 (2006.01)

(52) U.S. Cl. .............. 257/324; 257/E29.309; 257/E21.423; 438/287; 438/954; 365/184

(58) Field of Classification Search ........... None
See application file for complete search history.

(56) References Cited

U.S. PATENT DOCUMENTS

| | | | |
|---|---|---|---|
| 6,335,554 B1 * | 1/2002 | Yoshikawa | 257/316 |
| 6,413,802 B1 * | 7/2002 | Hu et al. | 438/151 |
| 6,720,613 B1 * | 4/2004 | Chang | 257/315 |
| 7,091,551 B1 * | 8/2006 | Anderson et al. | 257/324 |
| 2003/0011020 A1 * | 1/2003 | Eitan | 257/314 |
| 2004/0021172 A1 * | 2/2004 | Zheng et al. | 257/316 |
| 2004/0119108 A1 * | 6/2004 | Chang | 257/315 |
| 2004/0135195 A1 * | 7/2004 | Ahn et al. | 257/315 |
| 2004/0235300 A1 * | 11/2004 | Mathew et al. | 438/689 |
| 2004/0251487 A1 * | 12/2004 | Wu et al. | 257/315 |
| 2005/0104117 A1 * | 5/2005 | Mikolajick et al. | 257/315 |
| 2005/0199913 A1 * | 9/2005 | Hofmann et al. | 257/204 |

FOREIGN PATENT DOCUMENTS

WO    WO2004023556    *    3/2004

OTHER PUBLICATIONS

Eitan et al, "*NROM: A Novel Localized Trapping, 2-Bit Nonvolatile Memory Cell*", IEEE Electron Device Letters, vol. 21, No. 11, Nov. 2000, pp. 543-545.
Huang et al., "Sub-50 nm P-Channel FinFET", IEEE Transaction on Electron Devices, vol. 48, No. 5, May 2001, pp. 880-886.

* cited by examiner

*Primary Examiner*—David Vu
*Assistant Examiner*—Hoang-Quan T Ho
(74) *Attorney, Agent, or Firm*—John P. O'Banion

(57) ABSTRACT

Charge migration in a SONOS memory cell is eliminated by physically separating nitride layer storage sites with dielectric material. Increased storage in a cell is realized with a double gate structure for controlling bit storage in line channels between a source and a drain, such as with a FinFET structure in which the gates are folded over the channels on sides of a fin.

6 Claims, 10 Drawing Sheets

TWO BIT/FOUR BIT SONOS FLASH MEMORY CELL

CROSS REFERENCE TO RELATED APPLICATIONS

This application claims priority under 35 U.S.C. § 119 from U.S. Provisional Patent Application No. 60/568,117, filed May 3, 2004, which is incorporated herein by reference for all purposes.

GOVERNMENT RIGHTS

The U.S. government has rights in the disclosed invention pursuant to DARPA Grant No. MDA972-01-1-0035 to the University of California.

BACKGROUND OF THE INVENTION

This invention relates generally to semiconductor memory devices, and more particularly the invention relates to nitride read only memory (NROM) employing silicon-oxide-nitride-oxide-silicon (SONOS) structure for two bit and four bit data storage.

Memory is a key semiconductor electronic device in many electronic appliances such as PC computer, cellular phone, digital camera, networking, telecommunications, handheld mobile terminal markets and so on. There are mainly three kinds of semiconductor memory in the market: DRAM, SRAM and flash memory. Although DRAM still dominates the market, flash memory begins to play more and more important role in the market share.

Aggressive scaling of the semiconductor memory cells and the dramatic increase in the memory array size demand high density/low cost flash memory. Recently NROM SONOS (poly-silicon-oxide-nitride-oxide-silicon) memory device (FIG. 1) has attracted a lot of attention since it offers 2 bits/cell storage, which doubles the memory density per chip and reduces the cost per bit.

In programming the NROM cell, the word line (poly gate) and the N+ bit line 2 (BL2) are biased at 9V and 5V to program Bit 2, respectively. Hot electrons are injected into a local portion of the silicon nitride charge trap layer near the bit line 2 junction. During erasure of the Bit 2, the poly gate and BL2 are biased at −5V and 5V, respectively; the band-to-band tunneling induced hot holes near the BL2 junction are injected into the local portion of the silicon nitride charge trap layer to erase the stored electrons there. A reverse reading scheme is used to read the Bit 2: the poly gate and the bit line 1 (BL1) are biased in the normal reading mode to read the Bit 2, while the bit line 2 is grounded. A similar scheme is used to program/erase/read Bit 1.

In principle, the NROM memory is more scalable than the conventional floating gate flash memory. However, scaling the channel length of the NROM memory cell below 100 nm is very difficult. There are mainly two reasons: charge migration and charge injection control.

Assume in FIG. 1 that the channel length is 60 nm. After Bit 2 is programmed, the electrons are distributed over the channel region of 20 nm and the drain region of 20 nm near the bit line 2 junction. Hence the spacing between these two bits is 20 nm. Unfortunately, the electrons in Bit 2 will migrate towards the center of the channel during retention. If the electrons migrate for 20 nm, they will enter the Bit 1 charge trap location. Therefore it will be difficult to read Bit 1 from Bit 2. Very often, electrons can migrate for more than 20 nm during 10 years retention. Then, Bit 1 and Bit 2 will be mixed so finally there is only one Bit for each memory cell.

Further, since the nitride charge trap layer is continuous, it is difficult to control the electron injection location and the hole injection location during the program/erase cycle. Some electrons may not be completely erased if the hole injection location does not exactly overlap the electron injection location, which causes reliability problem. The lateral charge migration makes it worse, since some electrons already migrate to the center of the channel where there is no hole injection during the erase cycle.

SUMMARY OF THE INVENTION

In accordance with an embodiment of the invention, the nitride storage sites in a NROM cell are physically separated by an insulator such as oxide to prevent lateral charge migration between the storage sites. Further, the charge injection locations are more controllable by controlling the lateral dimensions of the nitride charge storage sites.

In accordance with another embodiment of the invention, the oxide-nitride-oxide (ONO) gate structure is employed in a double gate MOSFET to realize four bits per cell. One such double gate MOSFET is the FinFET structure in which a gate is folded over an upstanding fin between a source and a drain, the ONO gate stack being sandwiched between the silicon fin and the control gate. Compression of a memory array can be realized by sharing channels with each Bit line contact.

The invention and objects and features thereof will be more readily apparent from the following detailed description and appended claims when taken with the drawings.

DETAILED DESCRIPTION

One Embodiment of the invention is a novel two-bit per cell SONOS flash memory that is scalable to sub 50 nm technology generation. The novel memory structure takes the advantage of both the NROM technology and a spacer technology, the nitride charge storage site at Bit 1 and Bit 2 are physically separated from each other by thermal oxide. Hence the lateral charge migration is eliminated and the charge injection location is more controllable by controlling the lateral dimension of the nitride charge storage site.

Buried bit line layout is utilized in the NROM memory, so the number of the bit line contacts along each bit line can be reduced to achieve small memory cell size. The process flow to fabricate our proposed memory structure is compatible with buried bit line layout, although other types of flash memory with nitride storage site formed by spacer technology are not compatible with buried bit line layout.

Figure 2A:
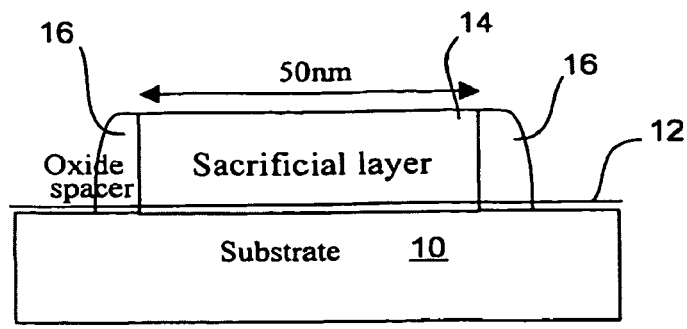
FIGS. 2A-2G are side views in section illustrating the fabrication of a NROM SONOS memory cell in accordance with one embodiment of the invention.
Figure 2B:
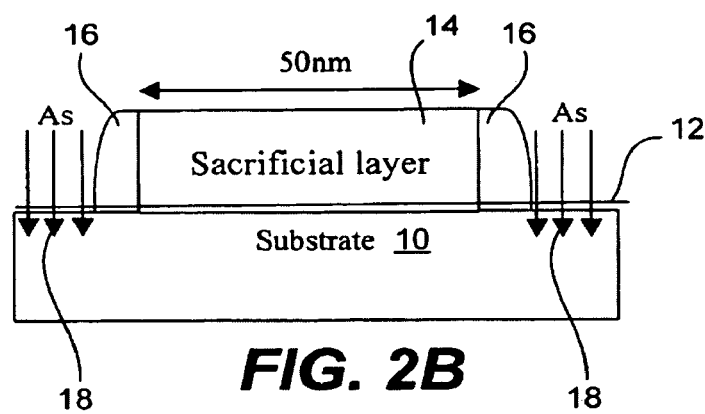
Figure 2C:
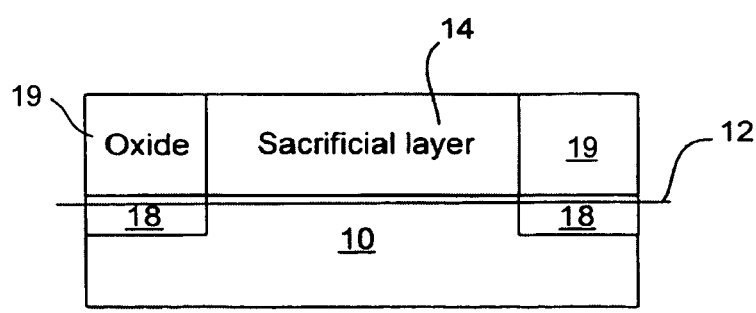
Figure 2D:
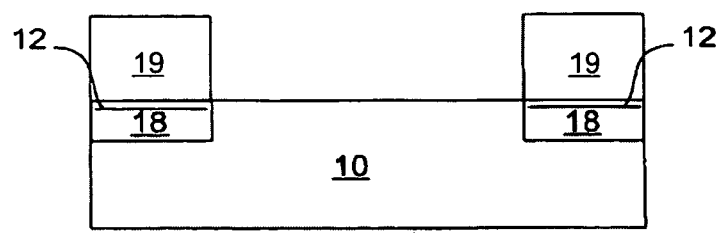
Figure 2E:
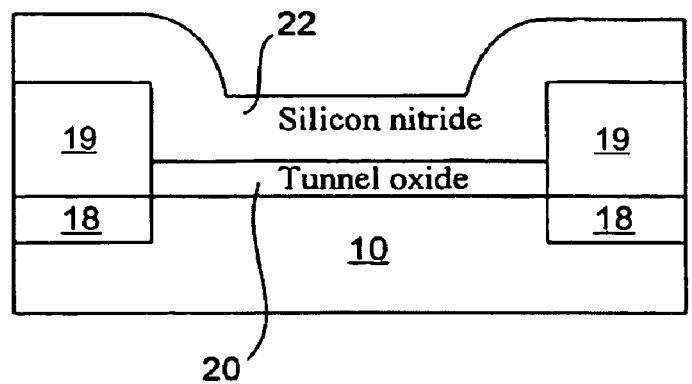
Figure 2F:
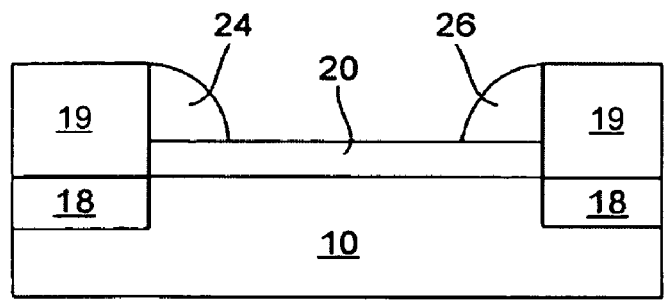
Figure 2G:
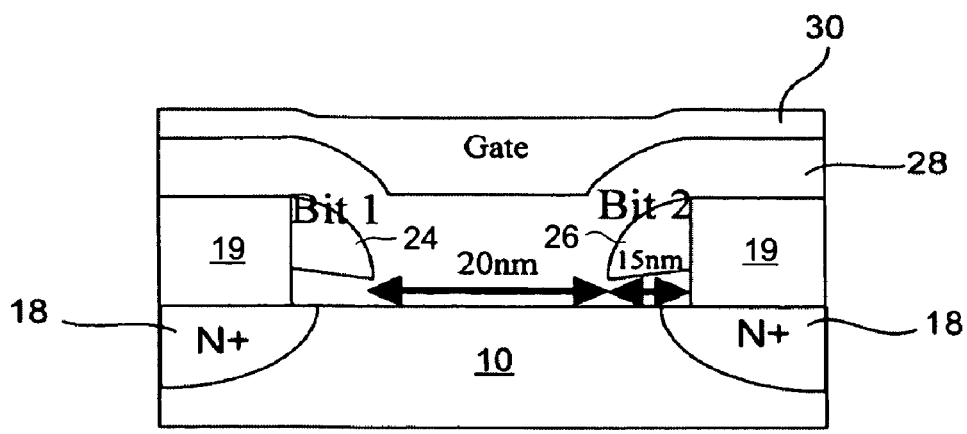

As shown in FIG. 2, a sacrificial layer 14 (for example, Ge or SiGe) is deposited on the bulk silicon substrate after 2 nm sacrificial oxide 12 is grown (FIG. 2A). The thickness (50~100 nm) of the sacrificial layer is chosen to control the height of the nitride spacers that are formed later. Then the sacrificial layer is patterned and etched. The width (50 nm) of the remaining sacrificial layer defines the channel length of the memory cell. After oxide spacer 16 formation by thermal oxidation, Arsenic is implanted to form the buried bit line 18 (FIG. 2B). A 200 nm low pressure chemical vapor deposited (LPCVD) oxide 19 is then deposited and polished by a conventional chemical mechanical polishing technique, as shown in FIG. 2C. The sacrificial layer 14 is selectively etched (FIG. 2D). After wafer cleaning and etching of the 2 nm sacrificial oxide 12 in 100:1 diluted HF, a 8 nm tunnel oxide 20 is thermally grown, followed by a 20 nm LPCVD nitride deposition 22 (FIG. 2E). The nitride layer is etched back to form two spacers 24 and 26, which are the nitride charge trap storage sites (FIG. 2F). The nitride charge trap layer is not continuous anymore. Hence the lateral migration of the charged electrons is eliminated. The control oxide 28 is formed either by high temperature oxide deposition or thermal oxidation of the nitride layer, followed by the poly-silicon gate deposition 30, as shown in FIG. 2G. A standard backend process finishes the fabrication process.

Figure 1:
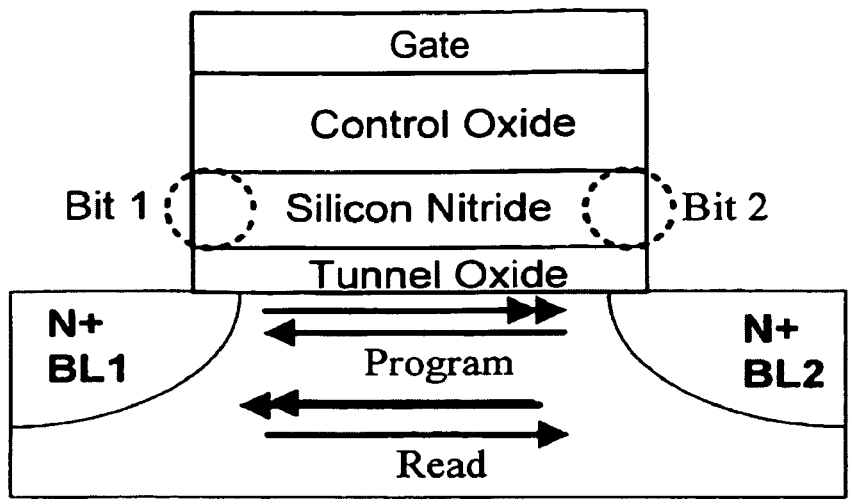
FIG. 1 is a side view in section of a conventional NROM SONOS memory cell.
Figure 3:
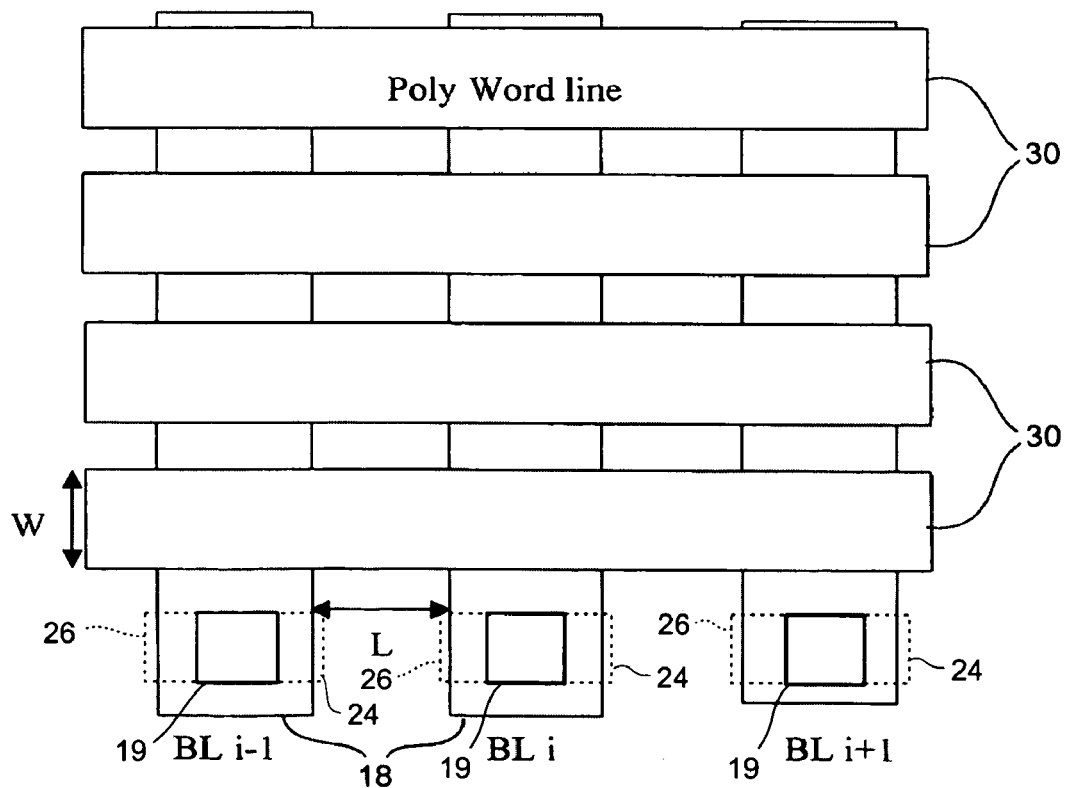
FIG. 3 is a top view of a memory array using the cell structure of FIG. 2G.
Figure 4:
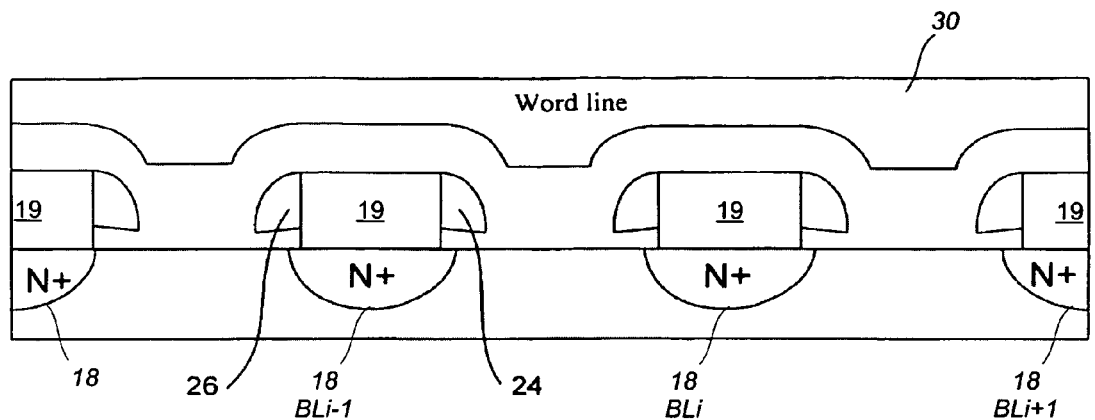
FIG. 4 is a section view along a word line in FIG. 3.

The memory chip layout is shown in FIG. 3 with the lowermost word line removed for clarity. The buried bit lines are formed before the gate stack formation. The number of bit line contacts along each bit line can be reduced to achieve small cell size. The cross section of the memory cells along a poly-silicon word line is shown in FIG. 4. There are to nitride storage sites that are separated by oxide in each channel.

Figure 5:
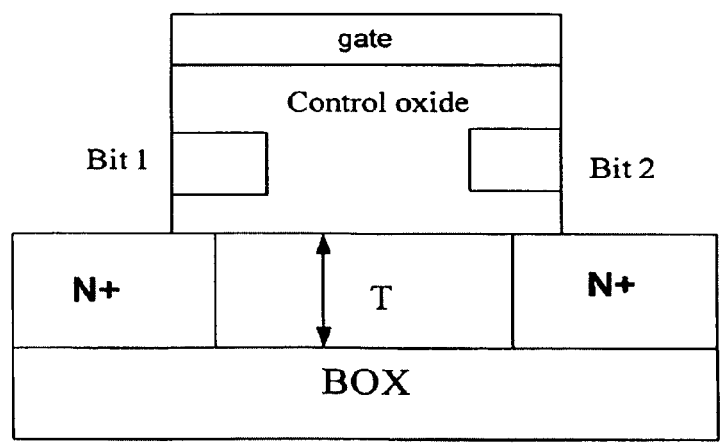
FIG. 5 is a section view of the cell structure in FIGS. 3 and 4 fabricated in a thin-body silicon on insulator MOSFET.

To scale flash memory devices below 100 nm because of their thick gate stack thickness, a fully depleted (FD) silicon-on-insulator (SOI) structure or FinFET can be used to suppress the short channel effects for sub-50 nm CMOS technologies. See U.S. Pat. No. 6,413,802. A thin silicon body or fin makes the gate length of a flash memory more scalable. Moreover, SOI flash memory eliminates cross coupling between devices by removing the shared body terminal. As shown in FIG. 5, the two-bit SONOS memory can be fabricated on the ultra-thin SOI body with a silicon layer overlying a buried oxide layer (BOX). The silicon body thickness T (10 nm~20 nm) can be adjusted by thermally oxidizing the starting silicon film and wet etching of the thermal oxide.

Figure 6A:
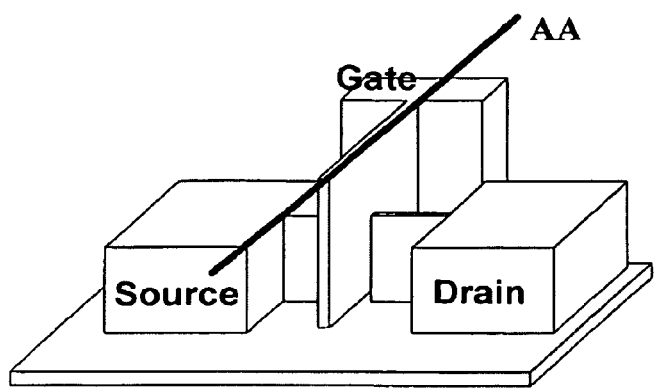
FIGS. 6A, 6B are a perspective view and a section view of a FinFET.
Figure 6B:
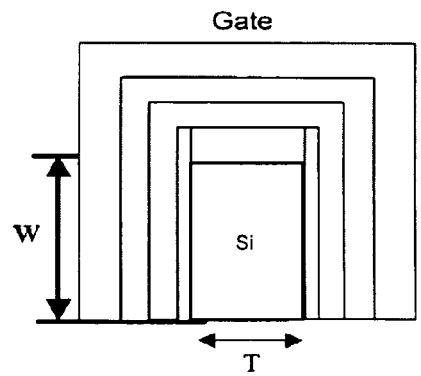
Figure 7:
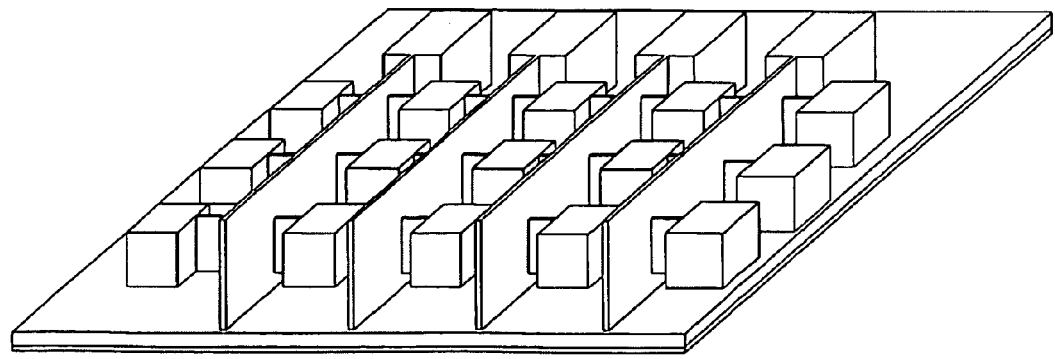
FIG. 7 is a perspective view of a conventional FinFET flash memory array.

A FINFET SONOS structure is shown in FIG. 6A with the ONO gate stack structure at cross section AA shown in FIG. 6B. The ONO gate stack is sandwiched between the Silicon Fin and the gate. Here, T is the Silicon Fin width and W is the Fin height (2W is the effective (electrical) channel width). The FINFET flash memory can operate in the same way as the conventional NROM. There are two storage bits: one at the source and one at the drain. The memory is sensed by utilizing a reverse reading scheme. A typical FINFET flash memory circuit is shown in FIG. 7. Herein, a NOR-type array structure is used as an example to demonstrate the operation principle, although 4 bit/cell operation is not limited to NOR-type array.

Figure 8:
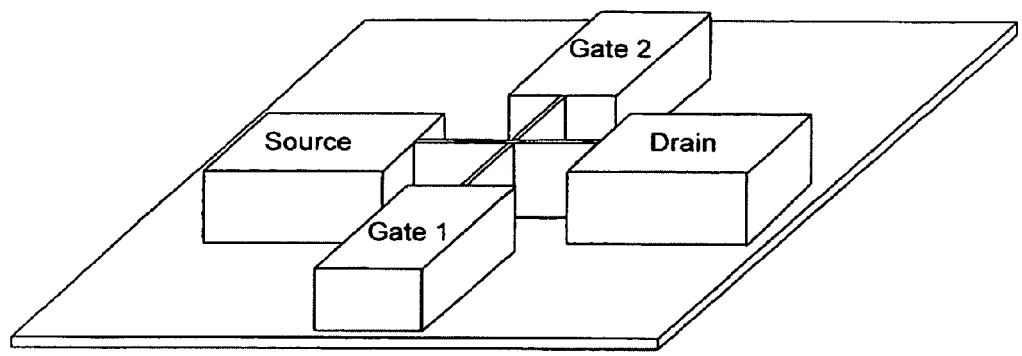
FIG. 8 is a perspective view of a conventional FinFET cell, utilized within an embodiment of the present invention.

4 physical bit/cell can be realized by breaking the top portion of the control gate on top of each channel. For example, a folded control gate in FIG. 6A is broken into two control gates by using a chemical mechanical polishing (CMP) method. As shown in FIG. 8, these two control gates control each vertical side of the channel region. Here the front gate is called "gate 1" and the back gate is called "gate 2" in each memory cell.

Figure 9:
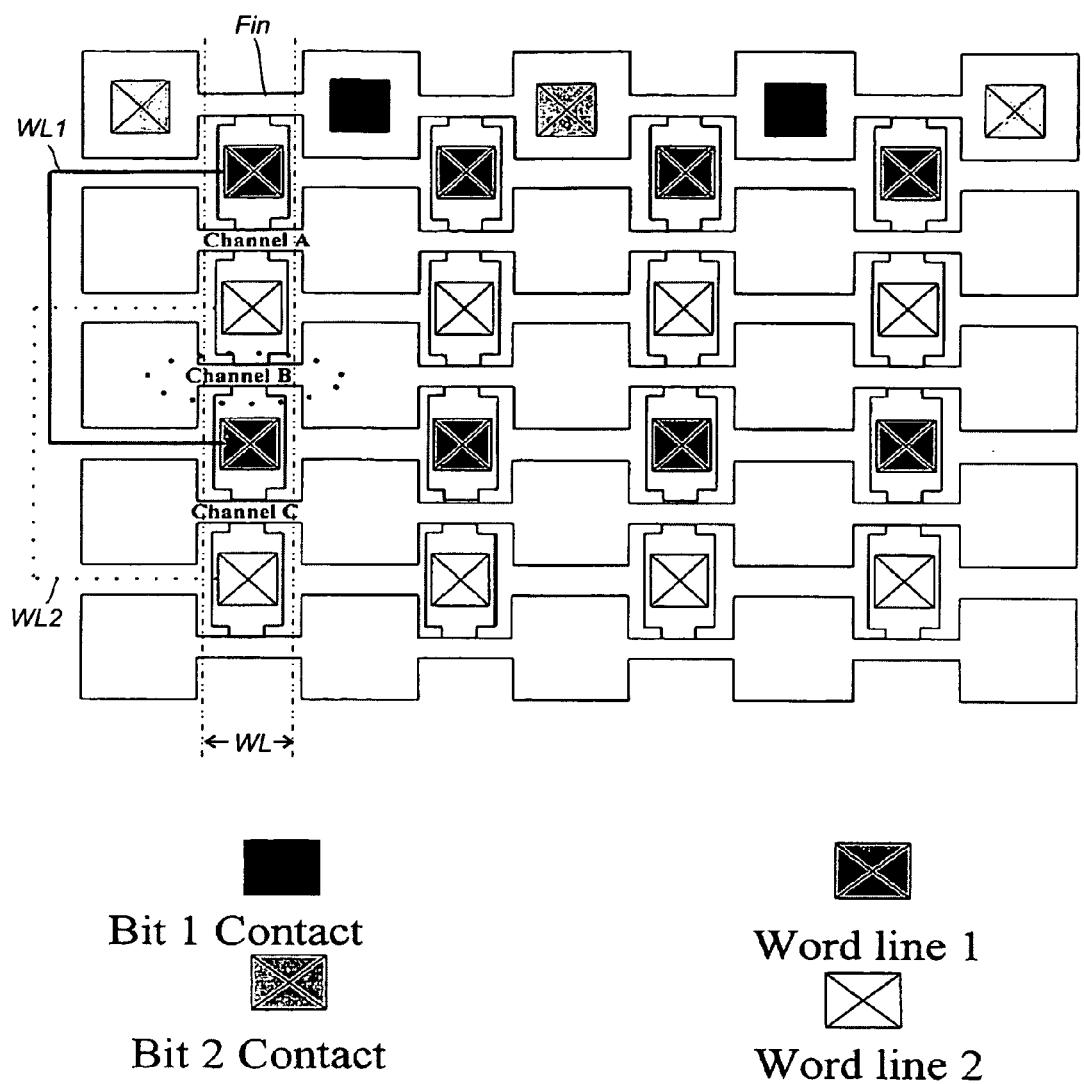
FIG. 9 is a plan view of a memory array similar to that of FIG. 7, after breaking each folded gate into two gates according to an aspect of the present invention.

The top view of the memory array layout in FIG. 7 is shown in FIG. 9 after breaking each folded gate into two gates. Here, a 5 rows 4 columns memory array is used as an example to demonstrate the memory array operation, although the actual chip array size is much bigger than that. The contact of the source line, bit line and the word line are shown in FIG. 9. In the channel B, for example, the front gate (gate 1) and the back gate (gate 2) control the front channel and the back channel of channel B, respectively. The front gate (gate 1 of channel B) of channel B is connected to the back gate (gate 2 of channel C) of channel C during the patterning of the control gates. The front gate of channel B and the back gate of channel C share the same word line (word line 1 as shown in the figure). The same connection is made to the front gate of channel A and the back gate of channel B (they share the word line 2).

Figure 10:
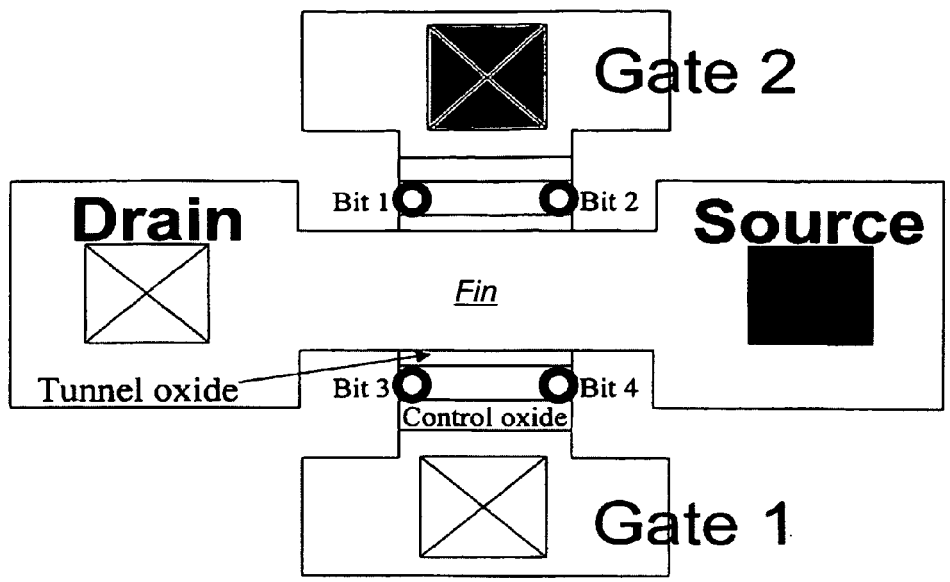
FIG. 10 is a plan view of 4 Bit storage in the FinFET cell of FIG. 8, according to an aspect of the present invention.

As shown in FIG. 10, there are two word lines in each column (Bits 1, 2 and Bits 3, 4). This is how the memory density doubles without increasing the memory chip size significantly.

The top view of a single cell (for example, channel B in FIG. 5) is shown in FIG. 10. It will be noted that the tunnel oxide, trap storage layer (for example, nitride in NROM) and control oxide are formed along the sidewalls of the Silicon Fin. As shown in FIG. 10, the front gate (gate 1) and the back gate (gate 2) control the front side and the backside of the channel, respectively. There are source storage bit and drain storage bit (two bits/gate) associated with each gate, hence a total of 4 physical bit/cell is realized with the above structure.

Figure 11:
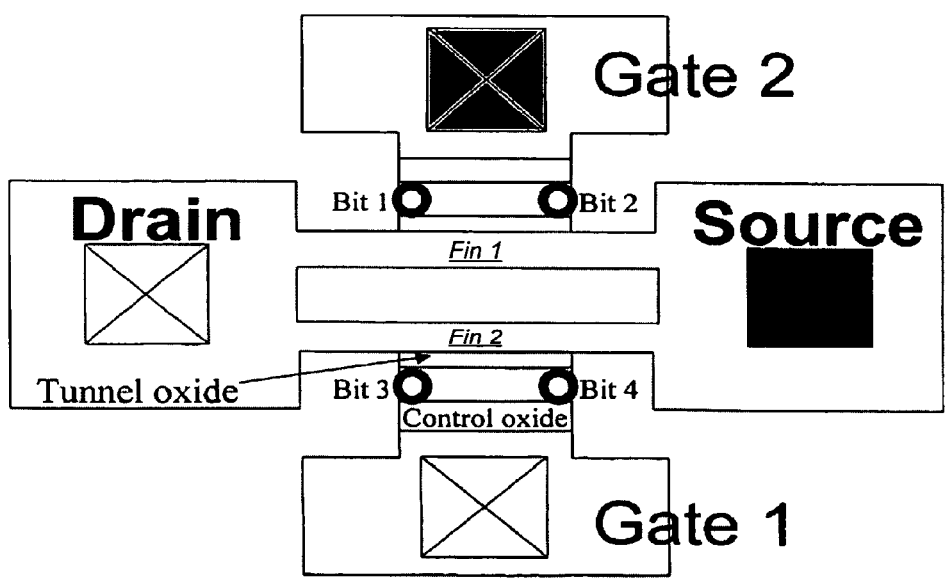
FIG. 11 is a plan view of a 4 Bit storage in another embodiment of a FinFET cell.

In FIG. 10, "Bit 3" may disturb "Bit 1" during reading. A more reliable structure is shown in FIG. 11. In FIG. 11, there are two channels or fins that are physically separate from each other in each memory cell, and each control gate controls one channel, respectively. In this way, all of 4 bits are both physically and electrically separate from each other, hence they do not interfere or disturb each other during programming/erasing or sensing.

Figure 12:
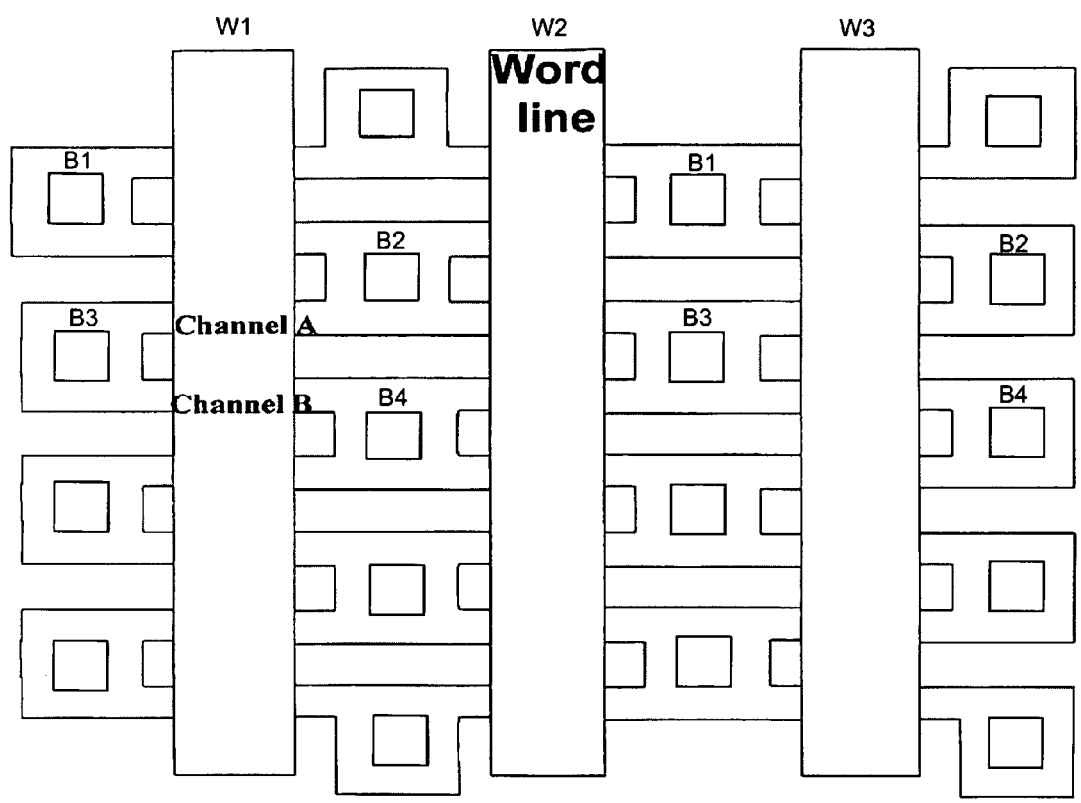
FIG. 12 is a plan view of a memory array in which each Bit line contact is shared by four channels to reduce array size.

In the array layout shown in FIG. 9, the word line contacts may consume some chip area, but this problem can be eliminated with the layout shown in FIG. 12. In FIG. 12, each Bit line contact (for example, "B4") shares one channel with each of the adjacent 4 Bit line contacts. In this layout, CMP is not required to form 4 physical bit/cells, that is, the top portion of the folded gate on the top of the Fin is not broken but can be continuous along each word line. The memory cell containing both channel A and channel B is used as the example to demonstrate the operation principle of the memory circuit, as shown in FIG. 13.

Figure 13:
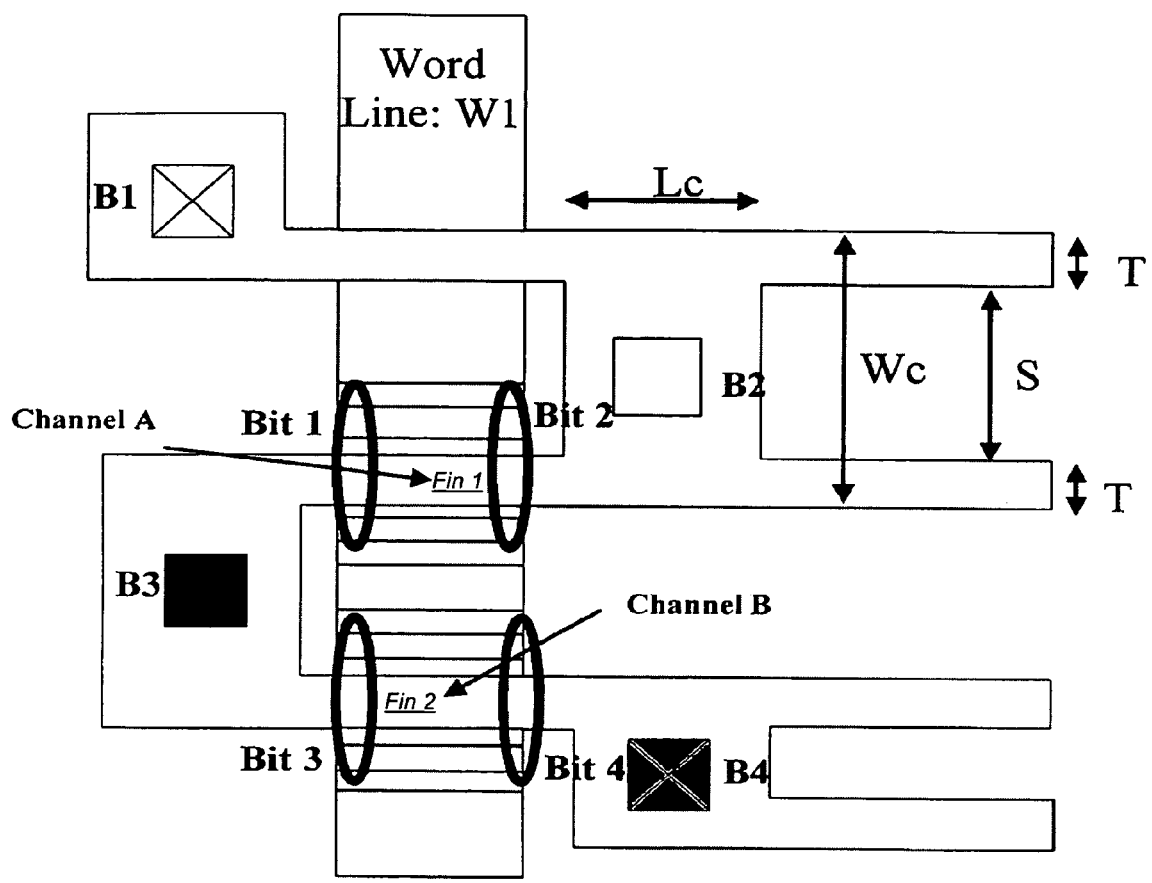
FIG. 13 is a plan view illustrating a shared Bit line contact.

As shown in FIG. 13, "Bit 1" and "Bit 2" share the same channel ("channel A"), Source/drain (Bit line "B2" and "B3") and same word line "W1". These two storage bits can be programmed/erase/read in the same way as that in the conventional NROM memory. That is, "Bit 1" and "Bit 2" can be distinguished from each other during program/erase/read operations. The same is true for "Bit 3" and "Bit 4".

It is evident that "Bit 1" and "Bit 4" can be distinguished from each other, the same as "Bit 2" and "Bit 3". The only two bits that need a special programming/reading scheme is "Bit 1" and "Bit 3". Fortunately, they can be distinguished using a "inhibit programming/reading voltage scheme" since they are associated with different channels.

For example, 9V is applied on the word line "W1" and 5V is applied at the Bit line "B3"when programming "Bit 1", while Bit line "B2" is grounded. To prevent Bit 3 from programming disturb, a 2.5V or even larger "inhibit voltage" can be applied on Bit line "B4". A similar scheme could be used when reading out "Bit 2" by applying an "inhibit voltage" to "Bit 4".

In the conventional bulk silicon flash memory chip, shallow trench isolation is required to isolate the memory cells from each other. However, the present memory circuit can be built on a 501 substrate, so a shallow trench isolation process step can be skipped, which significantly simplifies the fabrication process and reduces cell size.

Further, in the bulk silicon flash memory, much planar chip area is consumed if a wide channel is required for large reading current, which sacrifices chip density. However, in the present structure, the Fin height (W in FIG. 6B) is the channel width, increasing the Fin height can achieve wide channel width, which does not increase the planar chip area.

As shown in FIG. 13, the Bit line contact "B4" shares one channel with each of the 4 adjacent Bit line contacts, so the contact "B4" control 2 channels (0.5channel*4) in average. In the conventional NROM, each bit contact only controls one channel on average. (Each channel offers two storage bits). Thus, the structure, in accordance with this embodiment of the invention, doubles the memory chip density without increasing the memory chip size significantly.

The invention realizes improvements in SONOS memory cells and storage capacity through use of physical separation of charge storage sites and through use of double gate MOSFET structure which can accommodate four bits per cell.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A non-volatile semiconductor memory cell, comprising:
   a body having two semiconductor fins physically separated from each other;
   a source region disposed on each of the two semiconductor fins;
   a drain region disposed on each of the two semiconductor fins;
   two channels between said source region and said drain region with said two channels disposed on opposite, non-facing, sides of said two semiconductor fins;
   a tunnel oxide layer overlying each of said two channels on opposite, non-facing sides of said two semiconductor fins between said source region and said drain region;
   first and second charge storage regions overlying said tunnel oxide layer overlying each of said two channels between said source region and said drain region;
   four separate charge storage sites, each comprising charge-trapping material, within said first and second charge storage regions, wherein two physically separated charge storage sites are provided for each of said two channels;
   wherein said memory cell is disposed within a plurality of memory cells with said source region and said drain region each shared between two channels which are within the same or different memory cells within the plurality of memory cells;
   a control oxide layer overlying portions of each of said first and second charge storage regions overlying said tunnel oxide layer overlying each of said two channels between said source region and said drain region;
   at least one gate configured as a word line overlying said control oxide layer.

2. A non-volatile semiconductor memory cell as recited in claim 1, wherein said first and second charge storage regions traverse the width of said at least one gate electrode and define charge storage sites which are physically separated, in both a bit line direction and in a word line direction, to prevent charge migration between charge storage sites regions.

3. The SONOS flash memory cell as recited in claim 1, wherein in an array of memory cells a bit line contact is shared by four channels.

4. The SONOS flash memory cell as recited in claim 1, wherein the flash memory cell is in an array with a plurality of bit line contacts where each bit line contact shares four channels with two adjacent bit line contacts.

5. A non-volatile semiconductor memory cell as recited in claim 1, wherein said at least one gate comprises at least two gates with at least one gate overlying at least one of said two channels between said source region and said drain region, and wherein said gates are electrically interconnected.

6. A non-volatile semiconductor memory cell as recited in claim 1, wherein said at least one gate comprises at least two gates with at least one gate overlying at least one of said two channels between said source region and said drain region, and wherein said gates are independently biased.

* * * * *